(12) United States Patent
Moon et al.

(10) Patent No.: US 9,099,332 B2
(45) Date of Patent: Aug. 4, 2015

(54) LEAD FRAME FOR LIGHT EMITTING DEVICE PACKAGE, LIGHT EMITTING DEVICE PACKAGE, AND ILLUMINATION APPARATUS EMPLOYING THE LIGHT EMITTING DEVICE PACKAGE

(71) Applicant: Samsung Electronics Co., Ltd., Suwon-si, Gyeonggi-do (KR)

(72) Inventors: Kyung-mi Moon, Suwon-si (KR); Young-hee Song, Seongnam-si (KR); Ill-heung Choi, Hwaseong-si (KR); Jeong-wook Lee, Yongin-si (KR); Young-jin Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/137,885

(22) Filed: Dec. 20, 2013

(65) Prior Publication Data

US 2014/0103371 A1   Apr. 17, 2014

Related U.S. Application Data

(63) Continuation of application No. 13/092,468, filed on Apr. 22, 2011, now Pat. No. 8,638,037.

(30) Foreign Application Priority Data

Apr. 23, 2010  (KR) .................. 10-2010-0038180

(51) Int. Cl.
*H05B 37/00* (2006.01)
*H05B 39/00* (2006.01)
(Continued)

(52) U.S. Cl.
CPC .......... *H01L 25/075* (2013.01); *H01L 25/0753* (2013.01); *H01L 33/54* (2013.01); *H01L 33/62* (2013.01); *H01L 2224/48091* (2013.01); *H01L 2924/3025* (2013.01)

(58) Field of Classification Search
None
See application file for complete search history.

(56) References Cited

U.S. PATENT DOCUMENTS

| 7,201,511 B2 | 4/2007 | Moriyama et al. |
| 7,380,961 B2 | 6/2008 | Moriyama et al. |

(Continued)

FOREIGN PATENT DOCUMENTS

| CN | 2746539 Y | 12/2005 |
| CN | 101364585 A | 2/2009 |

(Continued)

OTHER PUBLICATIONS

Extended European Search Report issued in European Patent Application No. EP 11163499.4 dated Aug. 29, 2013.

(Continued)

*Primary Examiner* — Anh Tran
(74) *Attorney, Agent, or Firm* — McDermott Will & Emery LLP

(57) ABSTRACT

Lead frames for light emitting device packages, light emitting device packages, and illumination apparatuses employing the light emitting device packages. The lead frame including a plurality of mounting portions on which a plurality of light emitting device chips are mounted; a plurality of connection portions for circuit connecting the plurality of light emitting device chips; a terminal portion extended from the plurality of connection portions. The light emitting device package is formed by directly mounting the plurality of light emitting device chips on the lead frame and packaging the mounted light emitting device chips on the lead frame. The lead frame includes a plurality of connection portions for circuit connecting the plurality of light emitting device chips and a terminal portion in which a part of a circuit thereof is exposed.

20 Claims, 15 Drawing Sheets

(51) Int. Cl.
*H05B 41/00* (2006.01)
*H01L 25/075* (2006.01)
*H01L 33/54* (2010.01)
*H01L 33/62* (2010.01)

(56) References Cited

U.S. PATENT DOCUMENTS

| | | | |
|---|---|---|---|
| 8,089,140 B2 | 1/2012 | Huang et al. | |
| 8,319,245 B2 | 11/2012 | Huang et al. | |
| 8,638,037 B2* | 1/2014 | Moon et al. | 315/185 R |
| 2009/0154156 A1 | 6/2009 | Lo et al. | |
| 2009/0321758 A1 | 12/2009 | Liu et al. | |
| 2010/0072507 A1* | 3/2010 | Huang et al. | 257/99 |
| 2010/0252848 A1* | 10/2010 | Liang et al. | 257/98 |
| 2013/0037845 A1 | 2/2013 | Huang et al. | |

FOREIGN PATENT DOCUMENTS

| | | |
|---|---|---|
| CN | 100585274 A | 1/2010 |
| DE | 10 2007 041 136 A1 | 3/2009 |
| JP | 2002-094125 A | 3/2002 |
| JP | 2006-186197 A | 7/2006 |
| JP | 2009-252419 A | 10/2009 |
| KR | 10-2007-087270 | 8/2007 |
| KR | 10-2009-019510 | 2/2009 |
| KR | 10-2010-012170 | 2/2010 |

OTHER PUBLICATIONS

First Office Action dated Aug. 15, 2014 issued in corresponding Chinese Patent Application No. 201110103594.5 (English translation).

Chinese Second Office Action issued in counterpart Chinese Patent Application No. 201110103594.5 on Feb. 28, 2015; 34 pages with English translation.

* cited by examiner

LEAD FRAME FOR LIGHT EMITTING DEVICE PACKAGE, LIGHT EMITTING DEVICE PACKAGE, AND ILLUMINATION APPARATUS EMPLOYING THE LIGHT EMITTING DEVICE PACKAGE

CROSS-REFERENCE TO RELATED APPLICATIONS

This application is a Continuation of U.S. application Ser. No. 13/092,468, filed on Apr. 22, 2011, which claims the benefit of Korean Patent Application No. 10-2010-0038180, filed on Apr. 23, 2010, in the Korean Intellectual Property Office, the disclosures of which are incorporated herein in their entirety by reference.

BACKGROUND

1. Field

The present disclosure relates to lead frames for light emitting device packages used to package a plurality of light emitting device chips, light emitting device packages, and illumination apparatuses employing the light emitting device packages.

2. Description of the Related Art

Light emitting diodes (LEDs) are semiconductor devices which constitute a light emitting source through a PN junction of a compound semiconductor and thus may realize various colors of lights. LEDs have long lifetime, are easily made to be small and lightweight, have strong directivity of light, and thus are driven with low voltage. Also, LEDs are strong in terms of resistance to shock and vibration, do not require a warm-up time or complicated operation, and are easily packaged in various ways. Thus, LEDs may be applied in various fields.

In general, light emitting device chips such as LEDs are formed by performing a first packaging process and a second packaging process. In the first packaging process, phosphors and lenses are mounted on a lead frame to prepare a plurality of light emitting device chips. In the second packaging process, the plurality of light emitting device chips are mounted on a circuit board along with other devices to prepare a circuit.

In order to illuminate the light emitting devices such as LEDs, manufacturing costs thereof need to be reduced. In this regard, research into reducing the material cost and simplifying a manufacturing process is being widely conducted.

SUMMARY

Provided are lead frames for light emitting device packages which may simplify a packaging process by improving a package structure of light emitting device chips, light emitting device packages, and illumination apparatuses employing the light emitting device packages.

Additional aspects will be set forth in part in the description which follows and, in part, will be apparent from the description, or may be learned by practice of the presented embodiments.

According to an aspect of the present invention, a lead frame for a light emitting device package includes: a plurality of mounting portions on which a plurality of light emitting device chips are mounted, respectively; a plurality of connection portions for circuit connecting the plurality of light emitting device chips; a terminal portion extended from at least one of the plurality of connection portions; and a plurality of cleavage portions for connecting the plurality of mounting portions, the plurality of connection portions, and the terminal portion, wherein the cleavage portions are cut after the plurality of light emitting device chips are mounted.

The plurality of connection portions may include intermediate connection portions, a first connection portion, and a second connection portion, the intermediate connection portions connecting the plurality of light emitting device chips in series, the first connection portion electrically connected to a first electrode of the light emitting device chip disposed at the foremost of a series circuit in which the plurality of light emitting device chips are arranged in series, and the second connection portion electrically connected to a second electrode of the light emitting decice chip disposed at the rearmost of a series circuit in which the plurality of light emitting device chips are arranged in series, and wherein the terminal portion includes a first terminal extended from the first connection portion and a second terminal extended from the second connection portion.

The first connection portion, the intermediate connection portions, and the second connection portion may be arranged in a line, the first terminal may include a first front terminal disposed at the foremost in the line arrangement and a first rear terminal disposed at the rearmost in the line arrangement, the second terminal may include a second front terminal disposed at the foremost in the line arrangement and a second rear terminal disposed at the rearmost in the line arrangement, and the plurality of connection portions may include a first extension portion extended from the first connection portion to the first rear terminal along one side of the line arrangement and a second extension portion extended from the second connection portion to the second front terminal along the other side of the line arrangement.

The plurality of connection portions may include the first connection portion commonly connected to the first electrodes of the plurality of light emitting device chips and the second connection portion commonly connected to the second electrodes of the plurality of light emitting device chips so as to connect the plurality of light emitting device chips in parallel.

According to another aspect of the present invention, a light emitting device package includes: a plurality of light emitting device chips; and a lead frame comprising: a plurality of mounting portions to which the plurality of light emitting device chips are mounted; a plurality of connection portions for circuit connecting the plurality of light emitting device chips; and a terminal portion extended from at least one of the plurality of connection portions.

The plurality of light emitting device chips may include first and second light emitting device chips, the plurality of connection portions may include a first connection portion electrically connected to a first electrode of the first light emitting device chips, intermediate connection portions electrically connected to a second electrode of the first light emitting device chip and a first electrode of the second light emitting device chip, and a second connection portion electrically connected to a second electrode of the second light emitting device chip, and the terminal portion may incude a first terminal extended from the first connection portion and a second terminal extended from the second connection portion.

The plurality of connection portions may include intermediate connection portions electrically connecting the plurality of light emitting device chips in series, a first connection portion electrically connected to a first electrode of the light emitting device chip disposed at the foremost of a series circuit in which the plurality of light emitting device chips are arranged in series, and a second connection portion electrically connected to a second electrode of the light emitting device chip disposed at the rearmost of a series circuit in which the plurality of light emitting device chips are arranged in series, and the terminal portion includes a first terminal extended from the first connection portion and a second terminal extended from the second connection portion.

The plurality of light emitting device chips may be arranged in a line.

The first terminal may include a first front terminal disposed at the foremost of the plurality of light emitting device chips in the line arrangement and a first rear terminal disposed at the rearmost of the plurality of light emitting device chips in the line arrangement, the second terminal may include a second front terminal disposed at the foremost of the plurality of light emitting device chips in the line arrangement and a second rear terminal disposed at the rearmost of the plurality of light emitting device chips in the line arrangement, and the plurality of connection portions may include a first extension portion extended from the first connection portion to the first rear terminal along one side of the plurality of light emitting device chips in the line arrangement and a second extension portion extended from the second connection portion to the second front terminal along the other side of the plurality of light emitting device chips in the line arrangement.

The lead frame may be in the form of a long bar extended in a direction of the first and second extension portion.

The first extension portion and the second extension portion may be bonded to each other by the intermediate connection portions and bonding members formed of an insulating material.

The bonding members may be extended to the outside of at least a part of the first extension portion and the second extension portion. Furthermore, the bonding members may be integrally formed with reflective cavities as a single body, the reflective cavities reflecting light emitted from the plurality of light emitting device chips.

The light emitting device package may further include reflective cavities that reflect light emitted from the plurality of light emitting device chips, wherein the reflective cavities connect the first connection portion, the intermediate connection portions, and the second connection portion to each other.

The plurality of connection portions may include the first connection portion commonly connected to first electrodes of the plurality of light emitting device chips and the second connection portion commonly connected to second electrodes of the plurality of light emitting device chips so as to connect the plurality of light emitting device chips in parallel, and the terminal portion may include a first terminal extended from the first connection portion and a second terminal extended from the second connection portion.

At least a part of the lead frame may be insulation-coated.

The plurality of mounting portions may be prepared in a part of the plurality of connection portions.

The plurality of mounting portions, the plurality of connection portions, and the terminal portion may be formed of the same material.

The plurality of mounting portions may be disposed between the plurality of connection portions, and the plurality of mounting portions and the plurality of connection portions may be formed of an insulating material. The plurality of mounting portions may be formed of a heat conducting material.

The plurality of light emitting device chips may be each wire-bonded to the plurality of connection portions. The plurality of light emitting device chips may be each flip chip bonded to the plurality of connection portions.

The light emitting device package may further include reflective cavities that reflect light emitted from the plurality of light emitting device chips.

The light emitting device package may further include a lens that bends light emitted from the plurality of light emitting device chips.

The plurality of light emitting device chips may be covered with a transmissible resin. The transmissible resin may include a fluorscent material.

The plurality of light emitting device chips may be light emitting diode (LED) chips. The LED chips may include a GaN-based compound semiconductor.

According to another aspect of the present invention, an illumination apparatus includes: the above-described light emitting device package; and a power supply portion for supplying power to the light emitting device package.

The power supply portion may include: an interface for receiving power; and a power controller for controlling power supplied to the light emitting device package.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
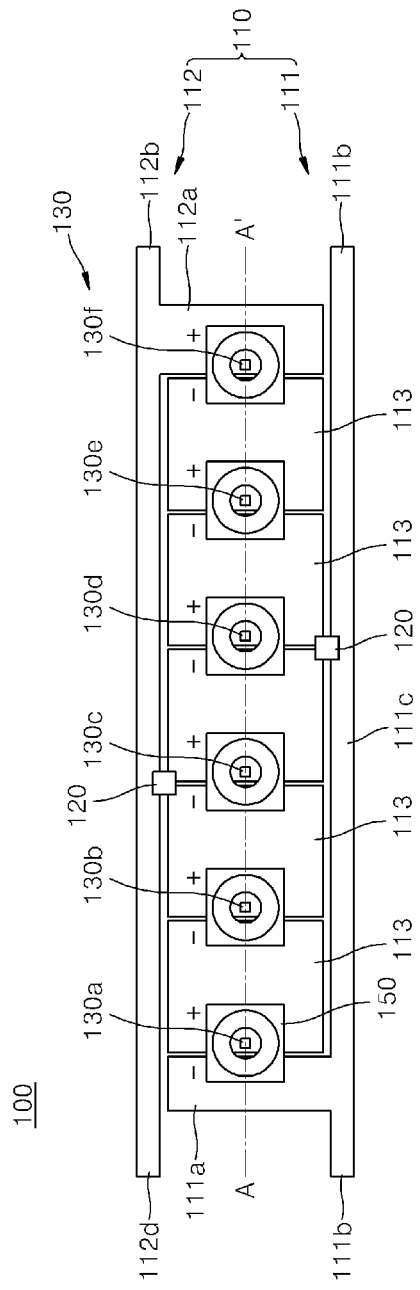
FIG. 1 is a plan view of a light emitting device package, according to an embodiment of the present invention.

Reference will now be made in detail to embodiments, examples of which are illustrated in the accompanying drawings, wherein like reference numerals refer to like elements throughout. In the drawings, the sizes or thicknesses of elements are exaggerated for clarity.

Figure 2:
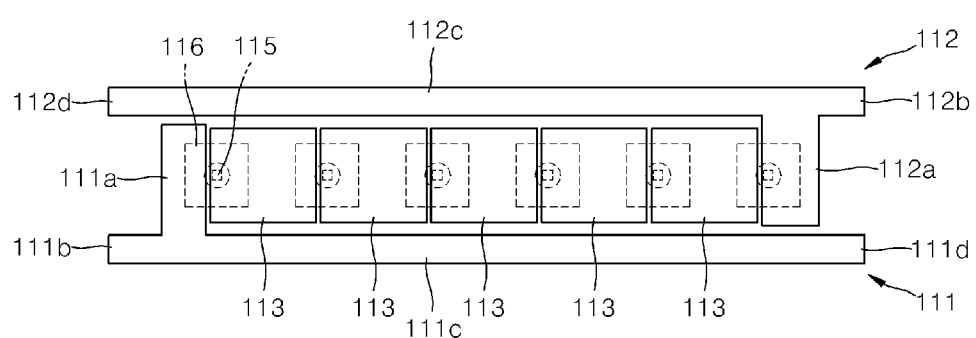
FIG. 2 is a plan view illustrating a location relationship between a lead frame used in the light emitting device package of FIG. 1 and a light emitting device chip portion.
Figure 3:
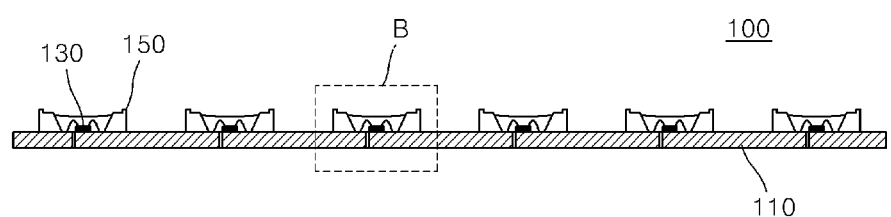
FIG. 3 is a side cross-sectional view of the light emitting device package of FIG. 1 cut along a line A-A' of FIG. 1.
Figure 4:
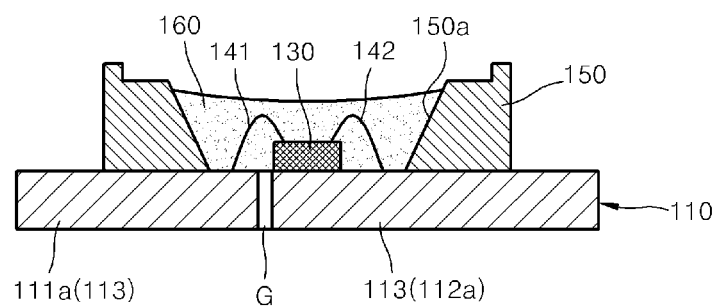
FIG. 4 is an enlarged cross-sectional view of a part B of FIG. 3.
Figure 5:
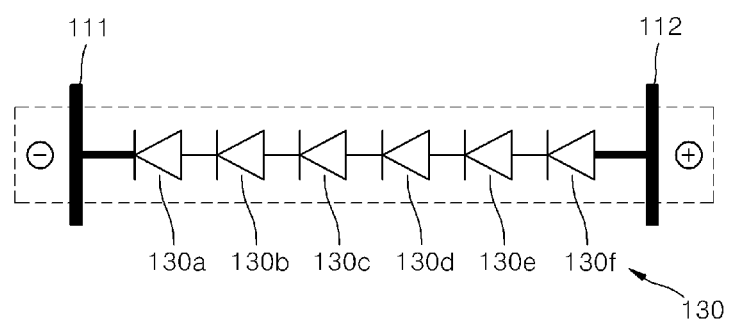
FIG. 5 is a circuit diagram of the light emitting device package of FIG. 1.

FIG. 1 is a plan view of a light emitting device package 100, according to an embodiment of the present invention, FIG. 2 is a plan view illustrating a location relationship between a lead frame used in the light emitting device package 100 of FIG. 1 and a light emitting device chip portion, FIG. 3 is a side cross-sectional view of the light emitting device package 100 of FIG. 1 cut along a line A-A' of FIG. 1, FIG. 4 is an enlarged cross-sectional view of a part B of FIG. 3, and FIG. 5 is a circuit diagram of the light emitting device package 100 of FIG. 1.

Referring to FIGS. 1 through 5, the light emitting device package 100 according to the current embodiment of the present invention includes a plurality of light emitting device chips 130, a lead frame 110 electrically connecting the plurality of light emitting device chips 130 to the outside, bonding members 120, and reflective cavities 150 reflecting light emitted from each of the plurality of light emitting device chips 130 and guiding the reflected light to the outside.

The lead frame 110 may be formed as illustrated in FIG. 2 by using a metal plate material such as aluminum or copper through pressing or etching. The lead frame 110 includes a first frame portion 111, a second frame portion 112, and intermediate connection portions 113, wherein the first frame portion 111 and the second frame portion 112 are separated from each other. The first frame portion 111, the second frame portion 112, and the intermediate connection portions 113 are bonded and fixed to each other by the bonding members 120 formed of insulating resin and the reflective cavities 150.

The first frame portion 111 includes a first connection portion 111a, a first front terminal 111b, a first extension portion 111c, and a first rear terminal 111d. The first connection portion 111a is connected to a negative electrode of a first light emitting device chip 130a disposed at the foremost of the plurality of light emitting device chips 130 that are arranged in a line. The first front terminal 111b is extended from the first connection portion 111a in a front end direction and the first rear terminal 111d is extended from the first connection portion 111a in a rear end direction. The first extension portion 111c that connects the first connection portion 111a to the first rear terminal 111d is spaced apart from the intermediate connection portions 113 by a predetermined distance along one side of the plurality of light emitting device chips 130 that are arranged in a line.

The second frame portion 112 includes a second connection portion 112a, a second rear terminal 112b, a second extension portion 112c, and a second front terminal 112d. The second connection portion 112a is connected to a positive electrode of a sixth light emitting device chip 130f disposed at the backmost of the plurality of light emitting device chips 130 that are arranged in a line. The rear terminal 112b is extended from the second connection portion 112a in a rear end direction and the second front terminal 112d is extended from the second connection portion 112a in a front end direction. The second extension portion 112c that connects the second connection portion 112a to the second front terminal 112d is spaced apart from the intermediate connection portions 113 by a predetermined distance along the other side of the plurality of light emitting device chips 130 that are arranged in a line.

The first front terminal 111b and the second front terminal 112d are disposed at the foremost of the light emitting device package 100 and thus are used as a negative electrode and a positive electrode, respectively. Also, the first rear terminal 111d and the second rear terminal 112b are disposed at the backmost of the light emitting device package 100 and thus are used as a negative electrode and a positive electrode, respectively. Thus, the first front terminal 111b, the second front terminal 112d, the first rear terminal 111d, and the second rear terminal 112b constitute terminal portions of the light emitting device package 100. The light emitting device package 100 according to the current embodiment of the present invention is fixed into a socket or other various forms of connector through the exposed terminal portions and thus may be used as an illumination module of an illumination apparatus. Here, soldering of the light emitting device package 100 to a separate PCB is not required. The terminal portions according to the current embodiment of the present invention include the first and second front terminals 111b and 112d and the first and second rear terminals 111d and 112b. However, any one of them may be omitted.

The intermediate connection portions 113 are interposed between the first connection portion 111a and the second connection portion 112a. The intermediate connection portions 113 are disposed between the plurality of light emitting device chips 130 to connect positive electrodes thereof to negative electrodes thereof. The number of intermediate connection portions 113 may be less than the number of plurality of light emitting device chips 130 by one. For example, as illustrated in the drawings, when six light emitting device chips 130 exist, five intermediate connection portions 113 exist.

The intermediate connection portions 113 connects the plurality of light emitting device chips 130 in series along with the connection portion 111a and the second connection portion 112a in a circuit. A circuit of the plurality of light emitting device chips 130 may be similar to that illustrated in FIG. 5.

A plurality of mounting portions 115 to which each of the plurality of light emitting device chips 130 is mounted are prepared on the intermediate connection portions 113 and the second connection portion 112a. That is, the plurality of mounting portions 115 are each prepared on some areas of the intermediate connection portions 113 and the second connection portion 112a, and bonding pads (not illustrated) which facilitate bonding of the plurality of light emitting device chips 130 may be attached to the plurality of mounting portions 115. In FIG. 2, reference numeral 116 indicates areas where the reflective cavities 150 are prepared, that is, reflective cavity formation portions. The reflective cavity formation portions 116 are formed throughout the first connection portion 111a, the intermediate connection portions 113, and the second connection portion 112a so that the first connection portion 111a, the intermediate connection portions 113, and the second connection portion 112a are fixed and bonded by the reflective cavities 150.

In addition, insulating layers (not illustrated) formed by being coated with an insulating material may be formed on areas other than parts for electrically connecting the plurality of light emitting device chips 130 or the terminal portions. The insulating layers may be formed of a same material as the reflective cavities 150 and may be formed together with the reflective cavities 150.

The plurality of light emitting device chips 130 may be light emitting diode (LED) chips including a positive electrode and negative electrode. The LED chips may emit blue light, green light, and red light according to materials of a compound semiconductor that forms the LED chips. Also, the LED chips may be coated with a fluorescent material and thus may emit white light. For example, a blue LED chip may include an active layer having a plurality of quantum well structures in which GaN and InGaN are alternately formed. A P-type clad layer and an N-type clad layer, both of which are formed of a compound semiconductor of $Al_xGa_yN_z$, may be formed on the upper side and the lower side of the active layer, respectively. In addition, a light diode chip disclosed in Korean Patent Application No. 2010-015422 or No. 2010-018259 may be used as the light emitting device chip according to the current embodiment of the present invention. In the current embodiment, the light emitting device chips are the LED chips. However, the present invention is not limited thereto and the plurality of light emitting device chips 130 may be, for example, UV light diode chips, laser diode chips, or organic light emitting diode (OLED) chips.

The plurality of light emitting device chips 130 are arranged in a line and are connected to the lead frame 110 in series in a circuit. As illustrated in FIG. 4, substrate surfaces of each of the plurality of light emitting device chips 130 are bonded to the intermediate connection portions 113 of the lead frame 110 or the second connection portion 112a and wires 141 and 142 are electrically wired to the first connection portion 111a, the intermediate connection portions 113, and the second connection portion 112a that are spaced apart from each other. Gaps G through which the first connection portion 111a, the intermediate connection portions 113, and the second connection portion 112a are spaced apart from each other may be filled with the same material as the reflective cavities 150 or may be empty.

In the current embodiment, six light emitting device chips 130 are prepared. However, the present invention is not limited thereto and the number of the light emitting device chips 130 may be appropriately selected according to a source of an illumination apparatus employing the light emitting device package 100. Also, in the current embodiment, the lead frame 110 has a repetitive pattern along an arranged direction of the light emitting device chips 130. Accordingly, the number of intermediate connection portions 113 may be easily changed according to the number of required light emitting device chips 130.

The reflective cavities 150 may be prepared for each of the plurality of light emitting device chips 130. The reflective cavities 150 reflect light emitted from the plurality of light emitting device chips 130 toward reflective surfaces 150a and allow the reflected light to be emitted at a predetermined angle range. Also, extraction efficiency of light emitted from the plurality of light emitting device chips 130 to the outside may be improved due to the reflective cavities 150. The reflective cavities 150 may be formed through an injection process at the same time as the bonding members 120 are formed. In this case, the reflective cavities 150 may be formed of the same insulating material as the bonding members 120. Examples of the insualting material may include epoxy resin, silicon resin, and plastic.

The plurality of light emitting device chips 130 may each be mounted on the inside of the reflective cavities 150 and then transmissible resins 160 may be each filled in the reflective cavities 150 to protect the plurality of light emitting device chips 130. In addition, the transmissible resin 160 includes a fluorescent material and thus may emit predetermined fluorescent light. For example, when the plurality of light emitting device chips 130 are blue LED chips or UV light diode chips, the transmissible resins 160 may include yellow, red, and green fluorescent powder and thus may emit white light. Examples of the fluorescent material may include a nitride-based fluorescent material, a sulfide-based fluorescent material, and a fluorescent material using a silicate-based fluorescent material or quantum dots.

In the current embodiment, the plurality of light emitting device chips 130 may be mounted in the reflective cavities 150 using wire bonding. However, the present invention is not limited thereto.

FIGS. 6 through 9 illustrate various modifications of the light emitting device chip 130 mounted in the light emitting device package 100 of FIG. 1.

Figure 6:
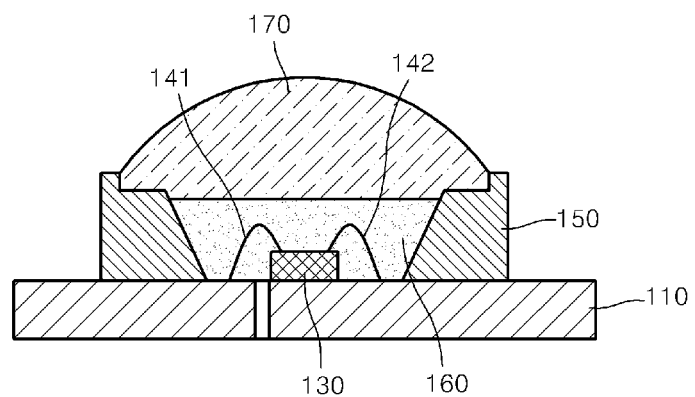
FIGS. 6 through 9 illustrate various modifications of a light emitting device chip mounted on the light emitting device package of FIG. 1.

Referring to FIG. 6, a lens 170 may be further prepared on the reflective cavities 150 to which the light emitting device chip 130 is mounted. The lens 170 may collect or diffuse light emitted from the light emitting device chip 130 so as to facilitate designing of light distribution. The lens 170 may be formed of transparent resin or glass and may be directly formed on the reflective cavity 150. Also, the lens 170 may be separately formed and then attached to the reflective cavity 150. The transmissible resin 160 and the lens 170 may be integrally formed with each other as a single body. Here, the embodiment of FIG. 6 is substantially the same as the previous embodiment except that the lens 170 is further prepared and thus a detailed description thereof will not be repeated.

In the previous embodiment, the reflective cavities 150 are prepared. However, the present invention is not limited thereto and the reflective cavities may be omitted as illustrated in FIGS. 7 and 8.

Figure 7:
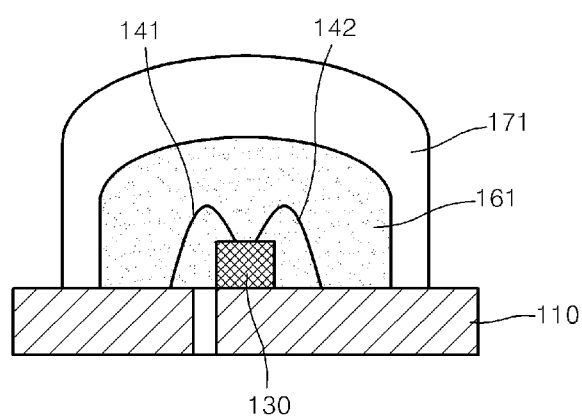

In FIG. 7, a transmissible resin 161 is directly coated on the wire-bonded light emitting device chip 130 without the reflective cavity. Various fluorescent materials are added to the transmissible resin 161 so that white light or other fluorescent colors may be emitted. In addition, as illustrated in FIG. 7, a lens 171 is further prepared on the transmissible resin 161 and thus may adjust the distribution of light by converging or diffusing light emitted from the light emitting device chip 130. The transmissible resin 161 and the lens 171 may be integrally formed with each other as a single body.

Figure 8:
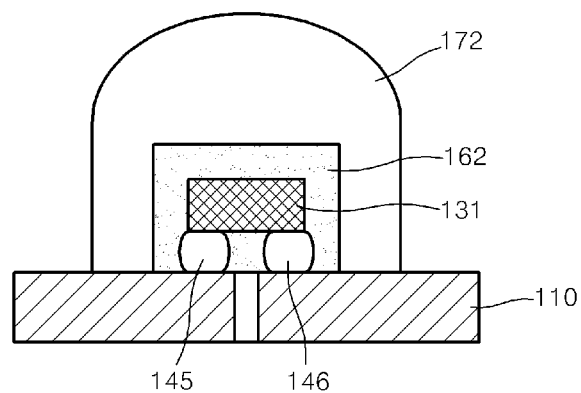

In FIG. 8, a light emitting device chip 131 is flip chip bonded to a substrate. In this case, the light emitting device chip 131 is electrically connected to the lead frame 110 by bumps 145 and 146 formed of a conductive material such as gold. In flip chip bonding, light from the light emitting device chip 131 is emitted through a surface opposite to the surfaces to which the light emitting device chip 131 is bonded. A transmissible resin 162 may be coated on the flip chip bonded light emitting device chip 131. A fluorescent material may be diffused to the transmissible resin 162. The transmissible resin 162 may cover the light emitting device chip 131 in the form of a film. In addition, a lens 172 may be further formed on the transmissible resin 162.

As illustrated in FIGS. 7 and 8, when the reflective cavities do not exist, the first connection portion 111a, the intermediate connection portions 113, and the second connection portion 112a in the lead frame 110 may be bonded through the transmissible resins 161 and 162 and the lenses 171 and 172 or may be fixed and bonded through separate bonding members (not illustrated).

Figure 9:
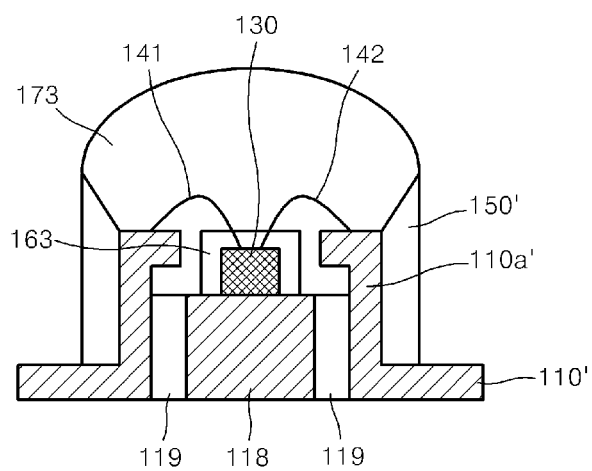

In FIGS. 1 through 8, the plurality of mounting portions to which the plurality of light emitting device chips 130 and 131 are mounted are prepared on the connection portions 111a, 112a, and 113 for electrical connection. However, the present invention is not limited thereto and the mounting portions may be disposed between the connection portions. Referring to FIG. 9, a lead frame 110' includes a bending portion 110'a and a heat slug 118 is disposed in a space prepared by the bending portion 110' a to be spaced apart from the bending portion 110' a. The heat slug 118 is fixed and bonded to the lead frame 110' through fixing members 119. The heat slug 118 is used as a mounting portion to which the light emitting device chip 130 is mounted. That is, the light emitting device chip 130 is attached to the heat slug 118 and is electrically connected to the bending portion 110' a of the lead frame 110' through wires 141 and 142. The heat slug 118 is formed of a metal having excellent heat conductivity and thus is used as a path for emitting light generated from the light emitting device chip 130. Also, the light emitting device chip 130 may be coated with a transmissible resin 163, wherein the transmissible resin 163 may include a fluorescent material. In addition, the light emitting device chip 130 may be surrounded by a reflective cavity 150' and a lens 173 may be formed thereon. In the embodiment of FIG. 9, the heat slug 118 is used to improve heat radiation. However, various well-known heat radiation structures may be employed.

Figure 10:
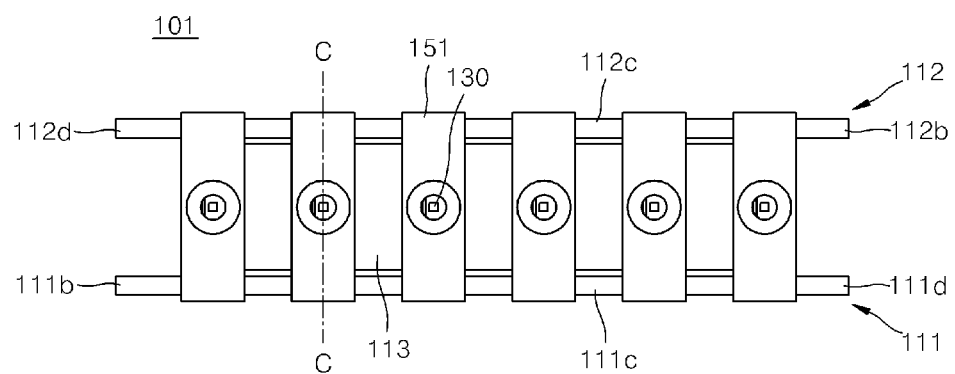
FIG. 10 is a plan view of a light emitting device package, according to another embodiment of the present invention.
Figure 11:
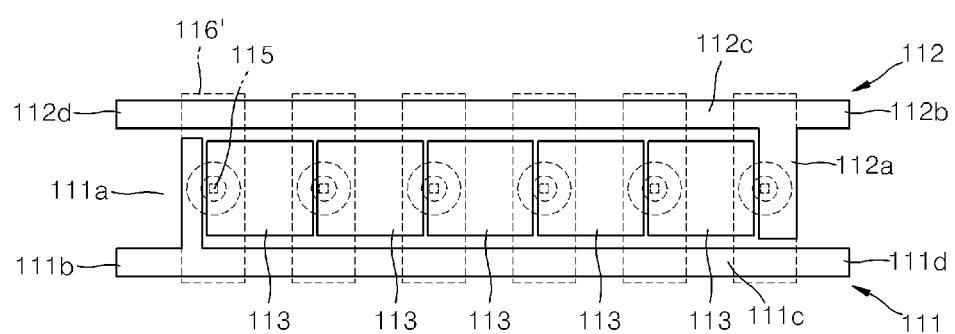
FIG. 11 is a plan view illustrating a location relationship between a lead frame used in the light emitting device package of FIG. 10 and a light emitting device chip portion.
Figure 12:
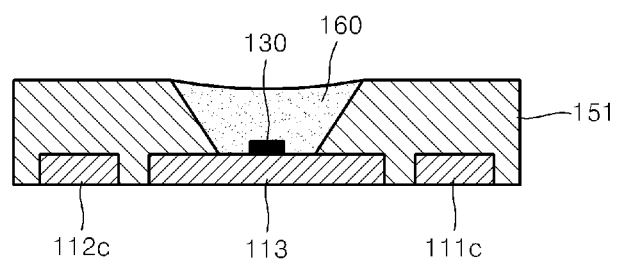
FIG. 12 is a side cross-sectional view of the light emitting device package of FIG. 10 cut along a line C-C' of FIG. 10.

FIG. 10 is a plan view of a light emitting device package 101, according to another embodiment of the present invention, FIG. 11 is a plan view illustrating a location relationship between a lead frame used in the light emitting device package 101 of FIG. 10 and a light emitting device chip portion, and FIG. 12 is a side cross-sectional view of the light emitting device package 101 of FIG. 10 cut along a line C-C' of FIG. 10. In FIG. 12, wires are not illustrated.

In the light emitting device package 101 according to the current embodiment of the present invention, elements other than reflective cavities 151 are the same as those in the light emitting device package 101 described with reference to FIGS. 1 through 5. Thus, only the reflective cavities 151 will be described in detail.

Referring to FIGS. 10 through 12, the reflective cavities 151 are extended in a direction perpendicular to an arrangement direction of the plurality of light emitting device chips 130 and thus cover the first extension portion 111c and the second extension portion 112c. That is, reflective cavities formation portions 116' include the outside of the first extension portion 111c and the second extension portion 112c. The reflective cavities 151 may be formed of insulating resin. As the reflective cavities 151 are extended to the first extension portion 111c and the second extension portion 112c, the first connection portion 111a, the intermediate connection portions 113, and the second connection portion 112a are not only fixed and bonded but also the first extension portion 111c and the second extension portion 112c may be fixed and bonded. Accordingly, in the current embodiment of the present invention, the lead frame 110 is fixed by the reflective cavities 151 without separate bonding members 120 of FIG. 1. In addition, the reflective cavities 151 cover the outside of the first extension portion 111c and the second extension portion 112c and thus the light emitting device package 101 may have an improved insulation property.

As illustrated in FIG. 12, the reflective cavities 151 may be formed only on the lead frame 110 to which the plurality of light emitting device chips 130 are mounted. In this case, the lower side of the lead frame 110 is exposed so as to efficiently emit light generated from the plurality of light emitting device chips 130. In some cases, the reflective cavities 151 may be formed to surround the lower side of the lead frame 110.

The reflective cavities 151 are formed for each of the plurality of light emitting device chips 130 and are spaced apart from each other. However, the present invention is not limited thereto and the reflective cavities 151 may be formed to cover areas other than mounting portions of the plurality of light emitting device chips 130 and terminal portions.

Figure 13:
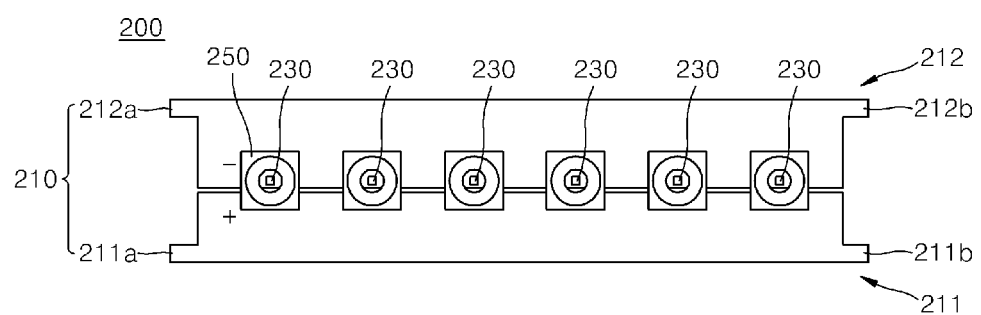
FIG. 13 is a plan view of a light emitting device package, according to another embodiment of the present invention.
Figure 14:
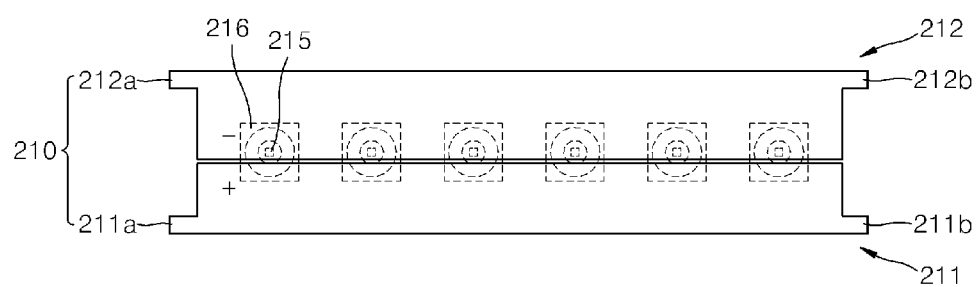
FIG. 14 is a plan view illustrating a location relationship between a lead frame used in the light emitting device package of FIG. 13 and a light emitting device chip portion.
Figure 15:
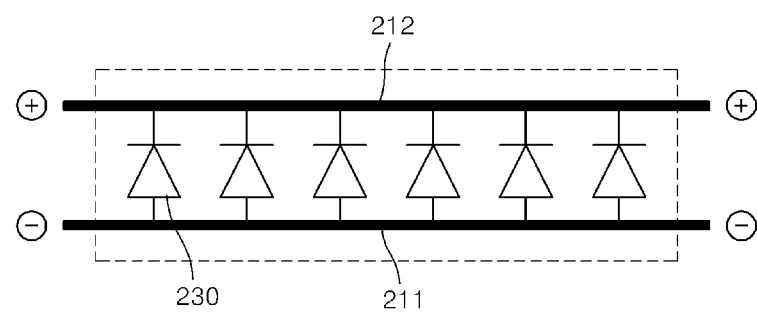
FIG. 15 is a circuit diagram of the light emitting device package of FIG. 13.

FIG. 13 is a plan view of a light emitting device package 200, according to another embodiment of the present invention, FIG. 14 is a plan view illustrating a location relationship between a lead frame used in the light emitting device package 200 of FIG. 13 and a light emitting device chip portion, and FIG. 15 is a circuit diagram of the light emitting device package 200 of FIG. 13.

In the light emitting device package 200 according to the current embodiment of the present invention, a plurality of light emitting device chips 230 are arranged in parallel. Referring to FIGS. 13 through 15, the light emitting device package 200 includes a lead frame 210, the plurality of light emitting device chips 230, and reflective cavities 250.

As illustrated in FIG. 14, the lead frame 210 includes a first frame portion 211 and a second frame portion 212 and has the form of a long bar. Both ends of the first frame portion 211 are extended a long way so as to form a first front terminal 211a and a first rear terminal 211b. Also, both ends of the second frame portion 212 are extended a long way so as to form a second front terminal 212a and a second rear terminal 212b. The first frame portion 211 and the second frame portion 212 are spaced apart from each other by a predetermined distance and a plurality of mounting portions 215 are formed on one side of the first frame portion 211 and the second frame portion 212. The light emitting device chips 230 are each mounted on the mounting portions 215 and electric wiring is accomplished through various well known bonding methods such as wire bonding or flip chip bonding. The reflective cavities 250 are formed to cover the first frame portion 211 and the second frame portion 212. Accordingly, the reflective cavities 250 reflects light emitted from the light emitting device chips 230 towards a predetermined direction and bonds the first frame portion 211 to the second frame portion 212.

The light emitting device chips 230 may be LED chips including a positive electrode and a negative electrode. For example, positive electrodes of the light emitting device chips 230 may be commonly and electrically connected to the first frame portion 211 and negative electrodes of the light emitting device chips 230 may be commonly and electrically connected to the second frame portion 212. Accordingly, as illustrated in FIG. 15, the light emitting device chips 230 are connected in parallel by the first frame portion 211 and the second frame portion 212.

Figure 16A:
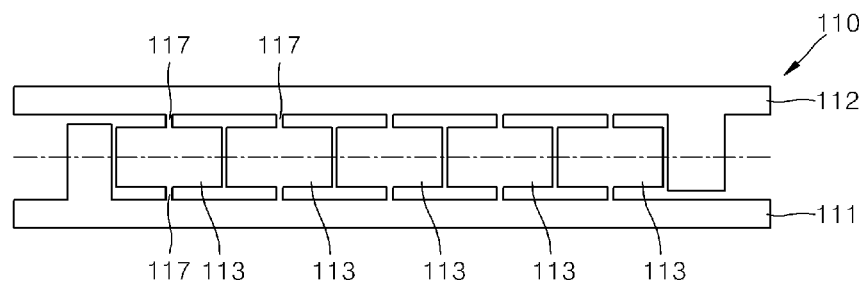
FIGS. 16A through 16G are views illustrating a method of manufacturing the light emitting device package of FIG. 1, according to an embodiment of the present invention.
Figure 16B:
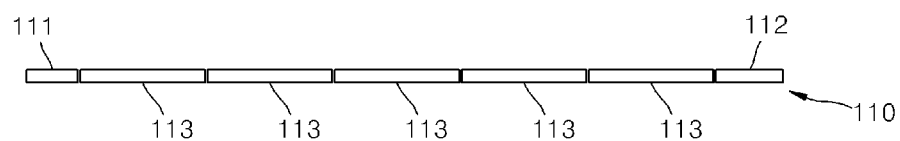
Figure 16C:
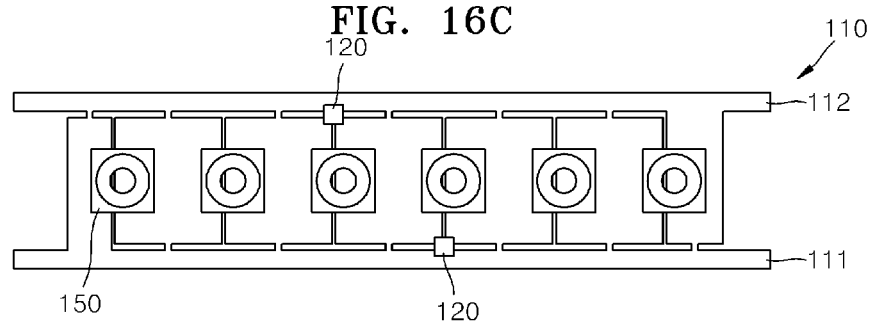
Figure 16D:
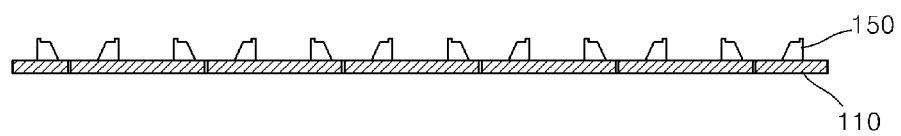
Figure 16E:
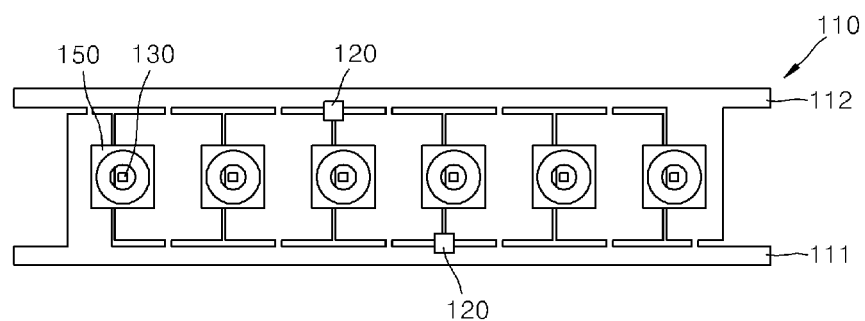
Figure 16F:
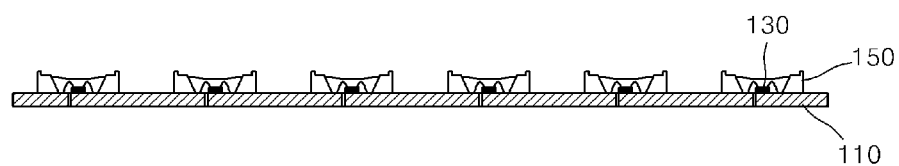
Figure 16G:
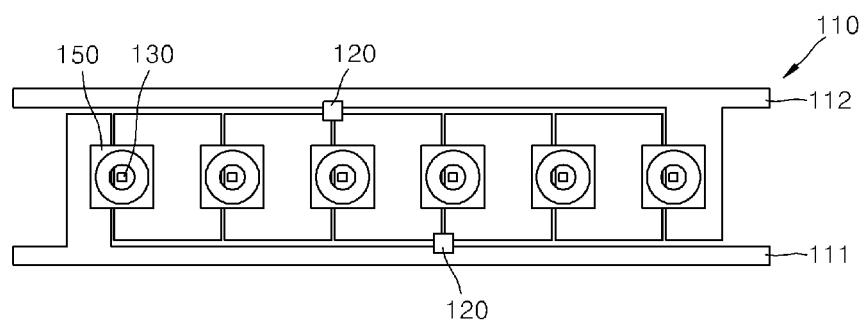
Figure 17A:
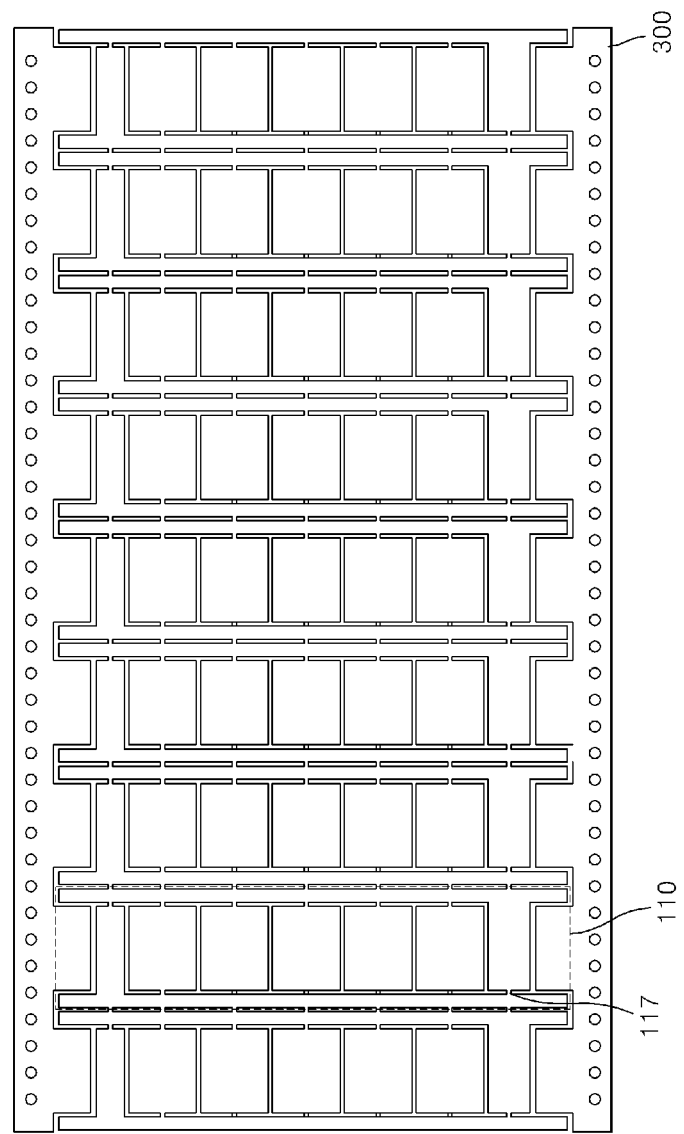
FIGS. 17A through 17C are diagrams illustrating lead frame sheets during manufacturing of the light emitting device package of FIG. 1.
Figure 17B:
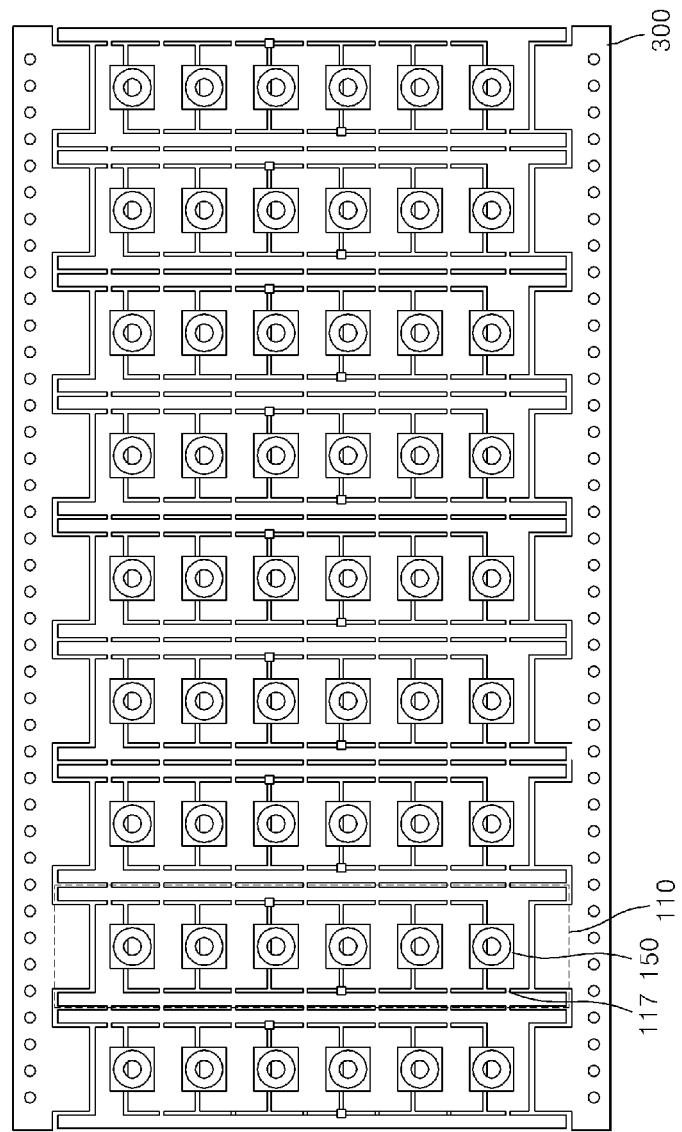
Figure 17C:
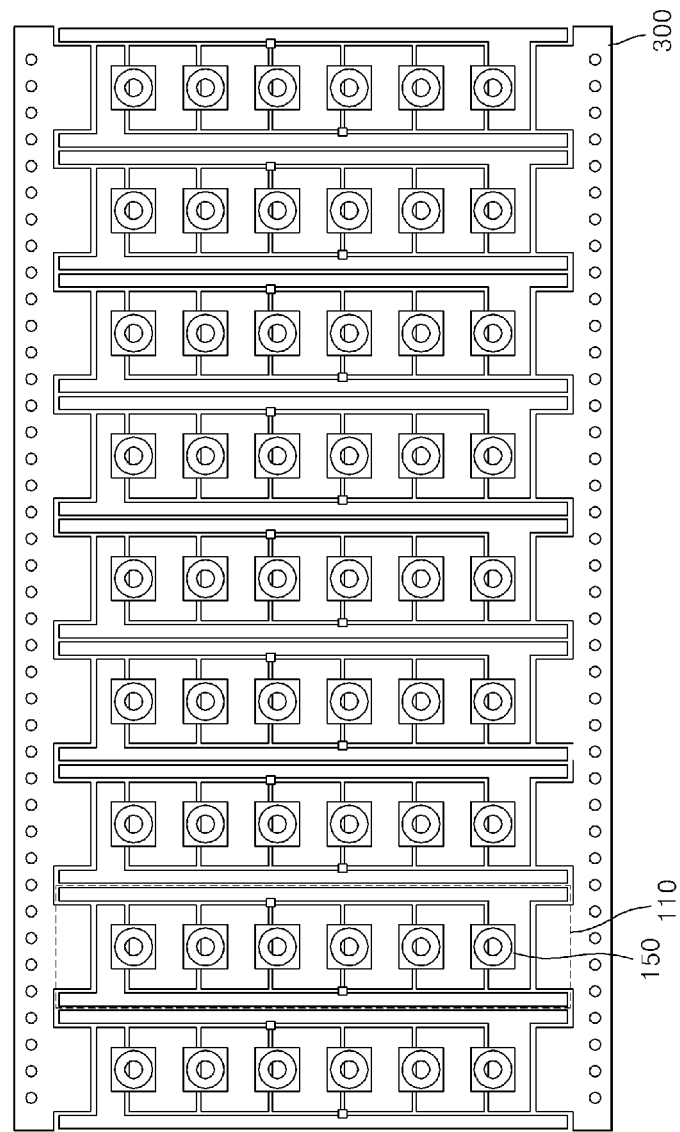

FIGS. 16A through 16G are views illustrating a method of manufacturing the light emitting device package 100 of FIG. 1, according to an embodiment of the present invention and FIGS. 17A through 17C are diagrams illustrating lead frame sheets during manufacturing of the light emitting device package 100 of FIG. 1.

Firstly, the lead frame 110 as illustrated in FIGS. 16A and 16B is prepared. FIG. 16A is a plan view of the lead frame 110 and FIG. 16B is a side cross-sectional view of the lead frame 110. A material and thickness of the lead frame 110 may be well-known. For example, the lead frame 110 may be patterned as illustrated in FIG. 16A by using a metal plate material such as aluminum or copper having a sub-millimeter thickness through pressing or etching. The lead frame 110 is connected and supported by the first frame portion 111, the second frame portion 112, the intermediate connection portions 113, and cleavage portions 117.

The lead frame 110 illustrated in FIGS. 16A and 16B are in one light emitting device package portion. As illustrated in FIG. 17A, a plurality of lead frames 110 may be formed on one lead frame sheet 300.

Then, as illustrated in FIGS. 16C and 16D, the reflective cavities 150 are formed on the lead frame 110. The reflective cavities 150 may be formed of plastic such as silicon resin or epoxy resin through injection molding. When the reflective cavities 150 are formed, the bonding members 120 may be also formed, wherein the bonding members 120 bond the first frame portion 111 to the intermediate connection portions 113 and the second frame portion 112 to the intermediate connection portions 113. In some cases, the reflective cavities 150 may be extended as illustrated in FIG. 10 and the bonding members 120 may be removed. The reflective cavities 150 and the bonding members 120 are formed in the lead frame sheet 300, as illustrated in FIG. 17B.

Then, as illustrated in FIGS. 16E and 16F, the plurality of light emitting device chips 130 are mounted on the lead frame 110. The plurality of light emitting device chips 130 may be die-attached to mounting portions of the lead frame 110 (refer to the mounting portions 115 of FIG. 2). Then, the plurality of light emitting device chips 130 are electrically wired using wires and the reflective cavities 150 are filled with transparent resin. In some case, lenses may be further prepared.

Then, as illustrated in FIG. 16G, the cleavage portions 117 of the lead frame 110 are removed and thus the lead frame 110 is separated, thereby completing manufacture of the light emitting device package 100. In FIG. 17C, the cleavage portions 117 are removed from the lead frame sheet 300.

In some cases, the cleavage portions 117 of the light emitting device package 100 may be removed before the plurality of light emitting device chips 130 are mounted and then electrically wired, and transparent resin is filled therein. When the cleavage portions 117 are removed, the plurality of light emitting device chips 130 are circuit connected. Thus, power may be supplied thereto so that an electrical wiring state or a light emission state of the plurality of light emitting device chips 130 may be tested. In this case, each of the light emitting device packages 100 may be attached in the lead frame sheet 300 using a well known method (for example, tie bar).

Figure 18:
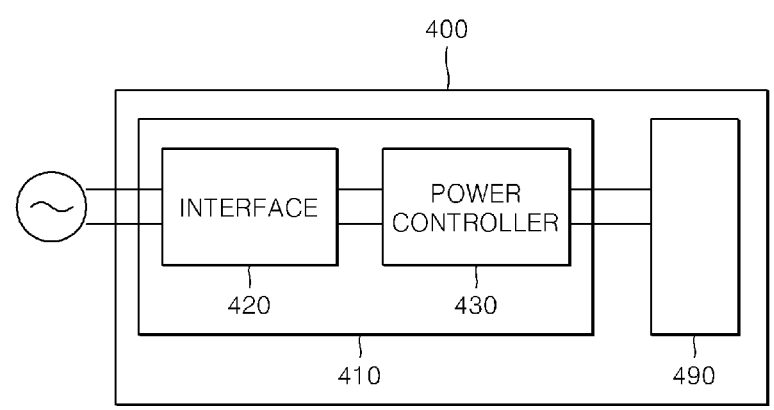
FIG. 18 is a block diagram of an illumination apparatus employing a light emitting device package, according to an embodiment of the present invention.

FIG. 18 is a block diagram of an illumination apparatus 400 employing a light emitting device package, according to an embodiment of the present invention.

Referring to FIG. 18, the illumination apparatus 400 according to the current embodiment of the present invention includes an illumination module 490 and a power supply portion 410 which supplies power to the illumination module 490.

The illumination module 490 may be the light emitting device package described with reference to FIGS. 1 through 15.

The power supply portion 410 may include an interface 420 that receives power and a power controller 430 that controls power supplied to the illumination module 490. The interface 420 may include a fuse that blocks an excessive current and an electromagnetic wave shielding filter that shields the interface 420 from an electromagnetic interference signal. Power may be supplied from the outside from an internally-installed battery. When an alternating power is input as power, the power controller 430 may further include a rectification portion and a constant voltage controller, wherein the rectification portion converts an alternating current (AC) into a direct current (DC) and the constant voltage controller converts voltage into voltage appropriate to the illumination module 490. When the power is a DC source having voltage appropriate to the illumination module 490 (for example, a battery), the rectification portion or the constant voltage controller may be omitted. Also, when a device such as AC-LED is employed as a light emitting device chip of the illumination module 490, alternating power may be directly supplied to the illumination module 490. In this case, the rectification portion or the constant voltage controller may be also omitted. In addition, the power controller 430 may control color temperature and may realize lighting presentation according to human sensitivity.

The light emitting device package used as the illumination module 490 packages a plurality of light emitting deivce chips into one module in order to secure sufficient light. As a general illumination module, light emitting device chips (for example, LED chips) are firstly packaged in the lead frame together with fluorescent materials and lenses and the firstly packaged light emitting device chips are secondly packaged by connecting the firstly packaged light emitting device chips in series and/or in parallel to be mounted on a printed circuit board (PCB). However, in the illumination apparatus 400 according to the current embodiment of the present invention, the light emitting device package 100 of FIG. 1, 101 of FIG. 10, or 200 of FIG. 13, packaged by connecting the plurality of light emitting device chips 130 of FIG. 1 or 230 of FIG. 13 in series and/or in parallel in the lead frame 110 of FIG. 1 or 210 of FIG. 13, is used as the illumination module. It is important to reduce manufacturing costs when commercializing a LED as a new light source of an illumination apparatus instead of a low-priced light source such as a fluorescent lamp. According to the embodiments of the present invention, circuits of the light emitting device chips are realized in the lead frame 110 or 210 and thus the light emitting device package 100, 101, or 200 may be directly used as an illumination module of an illumination apparatus through a single packaging process so that packaging may be simplified and manufacturing costs of an illumination module may be reduced.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing a light emitting device package, the method comprising:
   preparing a lead frame that comprises a first frame, a second frame, and an intermediate connection portion, wherein the intermediate connection portion is connected directly to both the first frame and the second frame via cleavage portions;
   mounting a light emitting device chip on a mounting portion of the intermediate connection portion; and
   removing the cleavage portions,
   wherein the first frame comprises a first extension portion extending in a first direction and a first connection portion protruding from a front end portion of the first extension portion in a direction toward the second frame,
   the second frame comprises a second extension portion extending parallel to the first extension portion and a second connection portion protruding from a rear end portion of the second extension portion in a direction toward the first frame,
   the lead frame comprises a plurality of the intermediate connection portions, each of the intermediate connection portions being arranged between the first extension portion and the second extension portion, and
   the first connection portion, the plurality of intermediate connection portions, and the second connection portion are arranged in a line in the first direction.

2. The method of claim 1, wherein a reflective cavity is arranged between the first connection portion and the intermediate connection portion, between two adjacent intermediate portions, or between the intermediate connection portion and the second connection portion.

3. The method of claim 2, wherein the reflective cavity extends toward at least one of the first extension portion and the second extension portion.

4. The method of claim 1, wherein the first frame comprises a first terminal that is connected to at least one of a front end and a rear end of the first extension portion, and
the second frame comprises a second terminal that is connected to at least one of a front end and a rear end of the second extension portion.

5. The method of claim 1, wherein the light emitting device chip is provided in multiple numbers,
the number of the plurality of intermediate connection portion is less by one than the number of the light emitting device chips, and
a first electrode is connected to the first frame, a second electrode is connected to the second frame, and the light emitting device chips are connected in series via the first connection portion, the plurality of intermediate connection portions, and the second connection portion.

6. The method of claim 1, wherein a gap exists between the first connection portion and the intermediate connection portion, between adjacent intermediate connection portions, and between the intermediate connection portion and the second connection portion,
the light emitting device chip is provided in multiple numbers,
each of the plurality of light emitting device chips is arranged at any one side with respect to the gap or across both sides, and
the plurality of light emitting device chips are connected in series by wire bonding or flip chip bonding.

7. The method of claim 2, wherein the reflective cavity is formed by injection molding.

8. The method of claim 2, wherein, when the reflective cavity is formed, a first bonding member fixing the first frame and the intermediate connection portion and a second bonding member fixing the second frame and the intermediate connection portion are formed altogether.

9. The method of claim 8, wherein, after the removing of the cleavage portion, the first frame, the second frame, and the intermediate connection portion are fixedly bonded by the reflective cavity, the first bonding member, and the second bonding member.

10. The method of claim 2, wherein the mounting of the light emitting device chip comprises:
die attaching the light emitting device chip to the mounting portion;
wire bonding the light emitting device chip; and
filling the interior of the reflective cavity with transparent resin.

11. The method of claim 10, wherein a lens is attached on the transparent resin after the reflective cavity is filled with the transparent resin.

12. A method of manufacturing a light emitting device package, the method comprising:
preparing a lead frame sheet comprising a plurality of lead frames, each of the lead frames comprising a first frame, a second frame, and an intermediate connection portion, wherein the intermediate connection portion is connected directly to both the first frame and the second frame via first cleavage portions and the plurality of lead frames are connected via a second cleavage portion;
mounting a light emitting device chip on a mounting portion of the intermediate connection portion; and
removing the first cleavage portions.

13. The method of claim 12, wherein, in the removing of the first cleavage portions, the second cleavage portion is also removed.

14. The method of claim 12, wherein the first frame comprises a first extension portion extending in a first direction and a first connection portion protruding from a front end portion of the first extension portion in a direction toward the second frame,
the second frame comprises a second extension portion extending parallel to the first extension portion and a second connection portion protruding from a rear end portion of the second extension portion in a direction toward the first frame,
the lead frame comprises a plurality of the intermediate connection portions, each of the intermediate connection portions being arranged between the first extension portion and the second extension portion,
the first connection portion, the plurality of intermediate connection portions, and the second connection portion are arranged in a line in the first direction; and
the lead frame sheet has a structure in which the lead frame is repeatedly provided in a second direction perpendicular to the first direction.

15. A method of manufacturing a light emitting device package, the method comprising:
preparing a lead frame comprising a first frame and a second frame;
mounting a plurality of light emitting device chips on mounting portions of the first frame to be surrounded by reflective cavities; and
electrically connecting the plurality of light emitting device chips in parallel with each other by electrically connecting each of the plurality of light emitting device chips to the first frame and to the second frame.

16. The method of claim 15, wherein after the mounting of the light emitting device chip, the method further comprises:
filling the interior of the reflective cavities with transparent resin.

17. The method of claim 15, wherein a gap exists between the first frame and the second frame, and
each of the reflective cavities is provided between the first frame and the second frame across the gap.

18. The method of claim 17, wherein a first electrode of each light emitting device chip is connected to the first frame, a second electrode of each light emitting device chip is connected to the second frame, and
each of the plurality of light emitting device chips is mounted in a respective reflective cavity.

19. The method of claim 1, further comprising:
prior to the removing of the cleavage portions, forming a first connecting member fixing the first frame and the intermediate connection portion without contacting the second frame, and a second connecting member fixing the second frame and the intermediate connection portion without contacting the first frame.

20. The method of claim 19, wherein the first and second connecting members are first and second reflective cavities, or first and second bonding members.

* * * * *